(12) United States Patent
Liu et al.

(10) Patent No.: US 10,248,261 B2
(45) Date of Patent: Apr. 2, 2019

(54) TOUCH PANEL, DISPLAY PANEL, DISPLAY DEVICE, AND METHOD FOR RECOGNIZING FINGERPRINT

(71) Applicant: BOE Technology Group Co., Ltd., Beijing (CN)

(72) Inventors: Yingming Liu, Beijing (CN); Xue Dong, Beijing (CN); Haisheng Wang, Beijing (CN); Xiaoliang Ding, Beijing (CN); Rui Xu, Beijing (CN); Changfeng Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/815,136

(22) Filed: Nov. 16, 2017

(65) Prior Publication Data

US 2018/0299982 A1 Oct. 18, 2018

(30) Foreign Application Priority Data

Apr. 17, 2017 (CN) .......................... 2017 1 0250465

(51) Int. Cl.
  *G06K 9/00* (2006.01)
  *G06F 3/041* (2006.01)
  *G06F 3/042* (2006.01)

(52) U.S. Cl.
  CPC ............ *G06F 3/042* (2013.01); *G06F 3/0412* (2013.01); *G06F 3/0416* (2013.01); *G06K 9/0004* (2013.01); *G06K 9/00013* (2013.01)

(58) Field of Classification Search
  CPC ...... G06F 3/0412; G06F 3/0416; G06F 3/042; G06K 9/00013; G06K 9/0004
  See application file for complete search history.

(56) References Cited

U.S. PATENT DOCUMENTS

| 2004/0252867 | A1* | 12/2004 | Lan | ................... | G06K 9/0004 |
|---|---|---|---|---|---|
| | | | | | 382/124 |
| 2017/0220844 | A1* | 8/2017 | Jones | ................... | G06K 9/0053 |

\* cited by examiner

*Primary Examiner* — Muhammad N Edun
(74) *Attorney, Agent, or Firm* — Arent Fox LLP; Michael Fainberg

(57) ABSTRACT

A touch panel, a display panel, a display device, and a method for recognizing a fingerprint are disclosed. The touch panel includes: an underlying substrate, a plurality of fingerprint recognizing units located on the underlying substrate, an encapsulation layer covering the plurality of fingerprint recognizing units, where each of the fingerprint recognizing units includes a light-emitting element and a photosensitive element; and a light path limiting structure arranged above the light-emitting element, where the light path limiting structure is arranged above the light-emitting element to enable light emitted from the light-emitting element to be totally reflected to thereby be transmitted in the light path limiting structure, and to exit the light path limiting structure by being concentrated in a small angle range.

19 Claims, 4 Drawing Sheets

TOUCH PANEL, DISPLAY PANEL, DISPLAY DEVICE, AND METHOD FOR RECOGNIZING FINGERPRINT

CROSS-REFERENCES TO RELATED APPLICATIONS

This application claims priority to Chinese patent application No. 201710250465.6 filed on Apr. 17, 2017, which is incorporated herein by reference in its entirety.

FIELD

The present disclosure relates to the field of touch display technologies, and particularly to a touch panel, a display panel, a display device, and a method for recognizing a fingerprint.

BACKGROUND

As the information era is coming, the security of information has been increasingly recognized, and fingerprints have been widely applied in encryption for security, and information recognition due to the uniqueness of information therein, so the development of fingerprint recognition technologies has also been widely favored.

In the prior art, a fingerprint is recognized in a display device typically by adding infrared light-emitting sub-pixels and fingerprint photosensitive elements to original pixels to recognize the fingerprint, but in such a recognition scheme, light emitted from the infrared light-emitting sub-pixels may be received by a plurality of fingerprint photosensitive elements in a wide range after being reflected, thus resulting in crosstalk to recognition of the fingerprint, which may hinder a valley and a ridge of the fingerprint from being recognized accurately, and thus the information from being verified.

Accordingly it is highly desirable to address how to prevent crosstalk between the light received by the fingerprint photosensitive elements so as to recognize accurately the fingerprint.

SUMMARY

An embodiment of the disclosure provides a touch panel, which includes: an underlying substrate; a plurality of fingerprint recognizing units located on the underlying substrate, each of the fingerprint recognizing units comprises a light-emitting element and a photosensitive element; an encapsulation layer covering the plurality of fingerprint recognizing units; and a light path limiting structure arranged above the light-emitting element, wherein: the light path limiting structure includes a central area, and a peripheral area surrounding at least a part of the central area, wherein the refractive index of the peripheral area is less than the refractive index of the central area; and the light path limiting structure is configured to enable light emitted from the light-emitting element to be reflected in the central area to the peripheral area, and to be totally reflected in the peripheral area, and then exit the side of the light path limiting structure away from the light-emitting element.

Correspondingly an embodiment of the disclosure further provides a touch display panel including a display panel, and the touch panel above.

Correspondingly an embodiment of the disclosure further provides a display device including the touch display panel above.

An embodiment of the disclosure provides a method for recognizing a fingerprint on a touch panel including a plurality of fingerprint recognizing units arranged in a matrix, wherein each of the fingerprint recognizing units includes a light-emitting element and a photosensitive element; wherein M*N fingerprint recognizing units are defined as a recognition group, and the recognition group includes at least two of the fingerprint recognizing units, there are a plurality of recognition groups in the touch panel, one of the fingerprint recognizing units in each recognition group is specified as a preset unit, and there are different preset units in different recognition groups; and the method for recognizing a fingerprint includes: upon determining a touch occurring, controlling the light-emitting elements in the preset units in the recognition groups to emit light in a period of time of one frame, where the light-emitting element in each preset unit emits light only once in the period of time of one frame; for each recognition group, determining initial light intensity values corresponding to the photosensitive elements in the recognition group according to light signals received by the photosensitive elements when the light-emitting element in the recognition group emits light; and recognizing the fingerprint according to the initial light intensity values corresponding to the photosensitive elements in the plurality of recognition groups.

DETAILED DESCRIPTION

Figure 1:
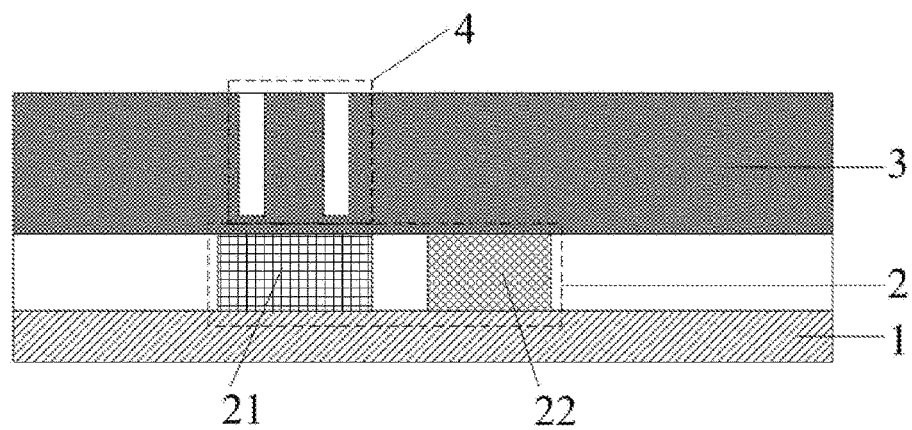
FIG. 1 is a first schematic structural diagram of a touch panel according to an embodiment of the disclosure.

In order to make the objects, technical solutions, and advantages of the embodiments of the disclosure more apparent, the disclosure will be described below in further details with reference to the drawings, and apparently the embodiments described below are only a part but not all of the embodiments of the disclosure. Based upon the embodiments here of the disclosure, all the other embodiments which can occur to those ordinarily skilled in the art without any inventive effort shall fall into the scope of the disclosure.

Implementations of a touch panel, a display panel, a display device, and a method for recognizing a fingerprint according to the embodiments of the disclosure may be described below in details with reference to the drawings.

The thicknesses and shapes of respective layers in the drawings are not intended to reflect an actual proportion, but only intended to illustrate the content of the disclosure.

A touch panel according to an embodiment of the disclosure as illustrated in FIG. 1 includes: an underlying substrate 1, a plurality of fingerprint recognizing units 2 (one fingerprint recognizing unit illustrated in FIG. 1 by way of an example) located on the underlying substrate 1, and an encapsulation layer 3 covering the plurality of fingerprint recognizing units 2, where the fingerprint recognizing unit 2 includes a light-emitting element 21 and a photosensitive element 22; and the touch panel further includes: a plurality of light path limiting structures 4, each light path limiting structure 4 is arranged above the light-emitting element 21.

The light path limiting structure 4 includes a central area, and a peripheral area surrounding at least a part of the central area, where the refractive index of the peripheral area is less than the refractive index of the central area; and the light path limiting structure 4 is configured to enable light emitted from the light-emitting elements 21 to be reflected in the central area to the peripheral area, and to be totally reflected in the peripheral area, and then exit the side of the light path limiting structure 4 away from the light-emitting elements 21.

The touch panel according to the embodiment of the disclosure includes: the underlying substrate, the plurality of fingerprint recognizing units located on the underlying substrate, and the encapsulation layer covering the plurality of fingerprint recognizing units, where each of the fingerprint recognizing units includes the light-emitting element and the photosensitive element; and the touch panel further includes: the light path limiting structure arranged above the light-emitting element. The light path limiting structure is arranged above the light-emitting element to enable the light emitted from the light-emitting element to be totally reflected to thereby be transmitted in the light path limiting structure, and to exit the light path limiting structure by being concentrated in a small angle range, so that the light is equivalently emitted from the light-emitting element by being nearly collimated, and incident on a fingerprint to be recognized, in a small range, so the light can be reflected at a concentrated angle, and the majority of the light can be incident on the photosensitive element corresponding to the light-emitting element, thus avoiding crosstalk between the light received by the photosensitive elements in the different recognizing units so as to recognize accurately the fingerprint.

In some embodiments of the disclosure, in the touch panel, the light path limiting structure can be located above the encapsulation layer, or can be located between the encapsulation layer and the light-emitting element, or of course, can be built in the encapsulation layer, although the embodiment of the disclosure will not be limited thereto.

In some embodiments of the disclosure, in the touch panel, the light path limiting structure is located between the encapsulation layer and the light-emitting element, so that the light path limiting structure can be located at a short distance from the light-emitting element to thereby enable the light emitted from the light-emitting element to be limited by the light path limiting structure as much as possible.

In some embodiments of the disclosure, in the touch panel, as illustrated in FIG. 1, the light path limiting structure 4 is arranged in the encapsulation layer 3, where a peripheral area of the light path limiting structure 4 is a groove arranged in the encapsulation layer 3. The light path limiting structure is arranged as such in the encapsulation layer so that the encapsulation layer is reused as the light path limiting structure to thereby reduce the number of layers arranged in the touch panel, and also enable the light path limiting structure to be located at a short distance from the light-emitting element so as to enable the light emitted from the light-emitting element to be limited by the light path limiting structure as much as possible.

Figure 2A:
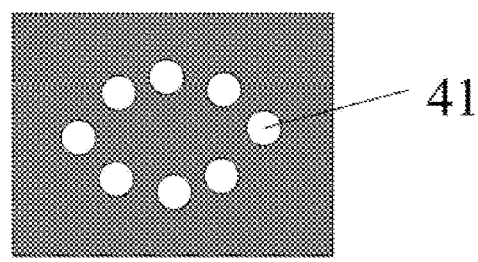
FIG. 2A and FIG. 2B are schematic structural diagrams of a light-limiting structure in the touch panel according to the embodiment of the disclosure respectively in sectional views.

In some embodiments of the disclosure, in the touch panel, in order to enable the light emitted from the light-emitting element to be totally reflected to thereby be transmitted in a central area of the light path limiting structure as much as possible, the peripheral area of the light path limiting structure can be arranged as a plurality of grooves 41 surrounding the central area as illustrated in FIG. 2A, where the number of grooves, and the density at which they are arranged can be defined to thereby enable the light emitted from the light-emitting element to be totally reflected to thereby be transmitted in the central area of the light path limiting structure.

Figure 2B:
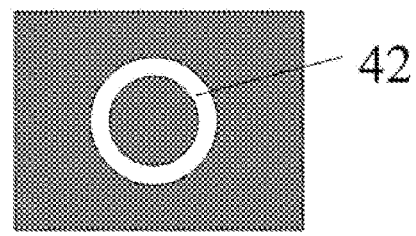

In some embodiments of the disclosure, in the touch panel, in order to enable the light emitted from the light-emitting element to be totally reflected to thereby be transmitted in the central area of the light path limiting structure, the peripheral area is an annular area 42 surrounding the central area as illustrated in FIG. 2B.

The peripheral area is arranged as the annular area to enable the light emitted from the light-emitting element to be better totally reflected in the central area so as to avoid the light from being leaked between the grooves due to a low density of the grooves, so that the light emitted from the light-emitting element is totally reflected in the central area as much as possible.

In some embodiments of the disclosure, in the touch panel, the grooves can be via-holes running through the encapsulation layer, or can be half-via-holes running through a part of the encapsulation layer as illustrated in FIG. 1. When the grooves are half-via-holes, they can block dust, humidity, oxygen, etc., from passing through the grooves, and eroding the light-emitting element, thus prolonging a service lifetime of the light-emitting element.

In some embodiments of the disclosure, in the touch panel, the air can be encapsulated in the grooves, and since the refractive index of the air is less than that of the encapsulation layer, the light can be transmitted from the optically dense medium to the optically sparse medium so that the light emitted from the light-emitting element can be totally reflected in the light path limiting structure to thereby be transmitted, and also a fabrication process can be reduced.

In some embodiments of the disclosure, in the touch panel, a filler can be further filled in the grooves, where the refractive index of the filler is less than that of the encapsulation layer, so that the light is totally reflected in the central area of the light path limiting structure to thereby be transmitted.

In some embodiments of the disclosure, the light-emitting element is typically organic electroluminescent element, and the organic electroluminescent element is significantly affected by humidity and oxygen. Optionally in the touch panel according to the embodiments of the disclosure, the filler is a humidity and oxygen blocking material to thereby guarantee a service lifetime of the light-emitting element.

Figure 3:
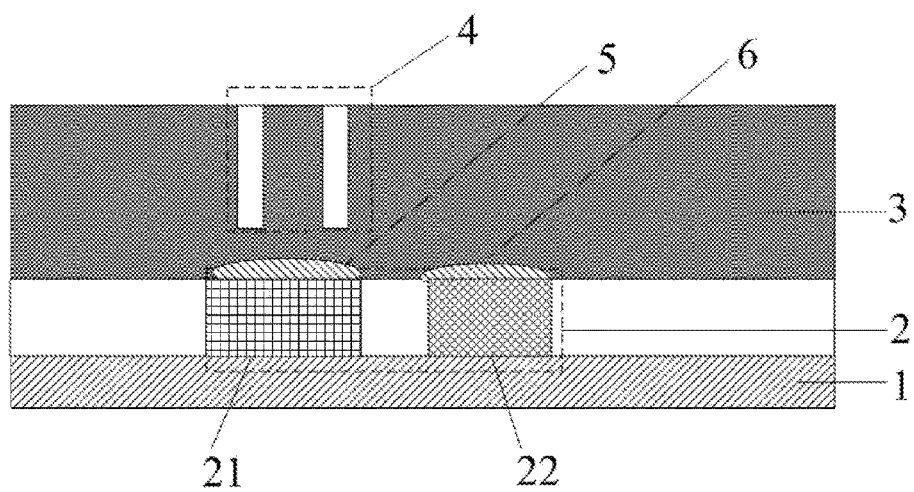
FIG. 3 is a second schematic structural diagram of a touch panel according to an embodiment of the disclosure.

In some embodiments of the disclosure, as illustrated in FIG. 3, the touch panel further includes a first light-condensing lens 5 located between the light-emitting element 21 and the light path limiting structure 4. The first light-condensing lens can condense the light emitted from the light-emitting element to thereby concentrate the light incident on the light path limiting structure.

In some embodiments of the disclosure, as illustrated in FIG. 3, the touch panel further includes a second light-condensing lens 6 located above the photosensitive element 22. The second light-condensing lens can be arranged above the photosensitive element to condense the received light reflected by the fingerprint to thereby improve the strength of the reflected light received by the photosensitive element so as to facilitate recognition and processing of an optical signal.

In some embodiments of the disclosure, in the touch panel, the light-emitting element can be infrared light-emitting element, or can be visible light-emitting element, although the embodiment of the disclosure will not be limited thereto.

In some embodiments of the disclosure, in the touch panel, the photosensitive element can be photosensitive diode, although the embodiment of the disclosure will not be limited thereto.

Based upon the same inventive idea, an embodiment of the disclosure further provides a touch display panel including a display panel, and any one of the above touch panels. Since the touch display panel addresses the problem under a similar principle to that of the touch panel above, reference can be made to the implementation of the touch panel above for an implementation of the touch display panel, so a repeated description thereof will be omitted here.

The touch display panel according to the embodiment of the disclosure includes: the underlying substrate, the plurality of fingerprint recognizing units located on the underlying substrate, and the encapsulation layer covering the plurality of fingerprint recognizing units, where the fingerprint recognizing unit includes the light-emitting element and the photosensitive element; and the touch panel further includes: the light path limiting structure arranged above the light-emitting element. The light path limiting structure is arranged above the light-emitting element to enable the light emitted from the light-emitting element to be totally reflected to thereby be transmitted in the light path limiting structure, and to exit the light path limiting structure by being concentrated in a small angle range, so that the light is equivalently emitted from the light-emitting element by being nearly collimated, and incident on a fingerprint to be recognized, in a small range, so the light can be reflected at a concentrated angle, and the majority of the light can be incident on the photosensitive element corresponding to the light-emitting element, thus avoiding crosstalk between the light received by the photosensitive elements in the different recognizing units so as to recognize accurately the fingerprint.

In some embodiments of the disclosure, in the touch display panel, the display panel can be a liquid crystal display panel, or can be an OLED display panel, although the embodiment of the disclosure will not be limited thereto.

In some embodiments of the disclosure, in the touch display panel, the display panel is arranged as an OLED display panel to thereby simplify a fabrication process.

Figure 4:
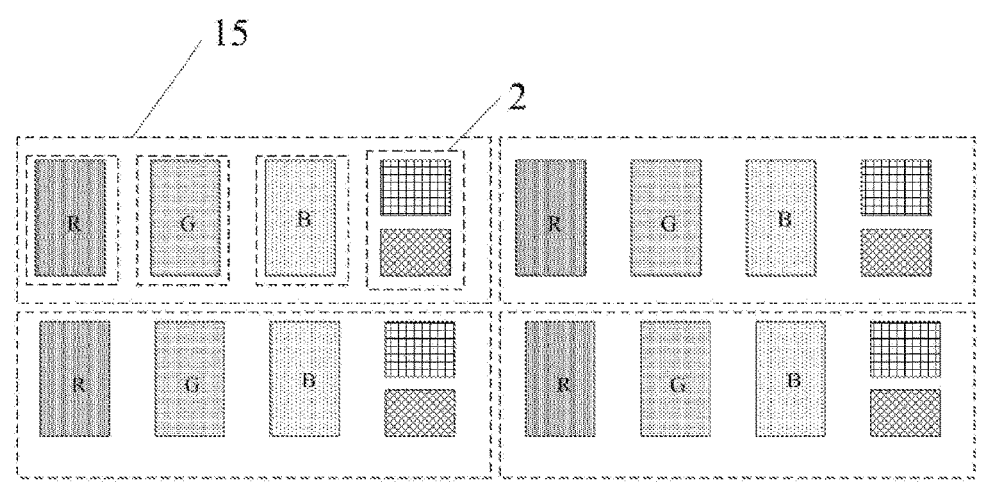
FIG. 4 is a schematic structural diagram of pixel areas in a display panel according to an embodiment of the disclosure.

In some embodiments of the disclosure, in the touch display panel, as illustrated in FIG. 4, the display panel includes a plurality of pixel areas 15 arranged in a matrix, where each pixel area 15 includes at least four sub-areas including one sub-area in which one of the fingerprint recognizing units in the touch panel is arranged, and the other sub-areas in which organic electroluminescent pixels for displaying (e.g., R, and B in FIG. 4) are arranged.

Figure 5:
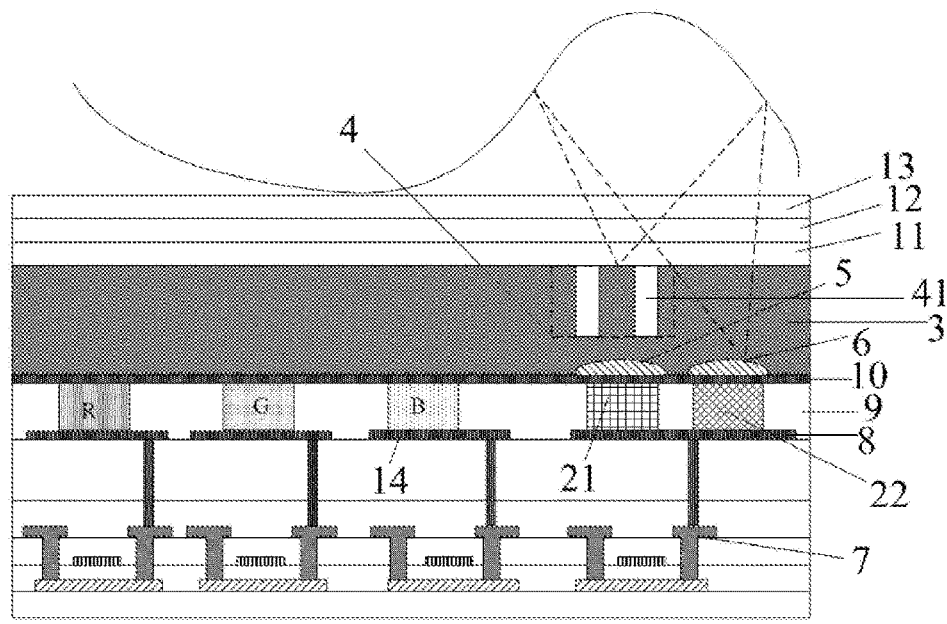
FIG. 5 is a schematic structural diagram of a touch display panel according to an embodiment of the disclosure.

In some embodiments of the disclosure, in the touch display panel, as illustrated in FIG. 5, the light-emitting element 21 is organic electroluminescent structure, and specifically includes an anode 8, a light-emitting layer 9, and a cathode 10.

In some embodiments of the disclosure, in the touch display panel, as illustrated in FIG. 5, the photosensitive element 22 is a photosensitive diode.

In some embodiments of the disclosure, in the touch display panel, as illustrated in FIG. 5, the photosensitive element 22 and the light-emitting element 21 share the anode 8 and the cathode 10.

In some embodiments of the disclosure, in the touch display panel, as illustrated in FIG. 5, the organic electroluminescent pixels, and the light-emitting element 21 in the fingerprint recognizing unit share the cathode 10, and anodes 14 of the organic electroluminescent pixels are arranged at the same layer as the anode 8 of the light-emitting element in the fingerprint recognizing unit.

In some embodiments of the disclosure, in the touch display panel, as illustrated in FIG. 5, the light-emitting element 21 and the photosensitive element 22 can be connected with a peripheral chip (not illustrated) through the same driver thin film transistor 7. Of course, the light-emitting element 21 and the photosensitive element 22 can alternatively be connected with the peripheral chip through different driver thin film transistor, although the embodiment of the disclosure will not be limited thereto.

In some embodiments of the disclosure, in the touch display panel, as illustrated in FIG. 5, when the display panel is an organic electroluminescent display panel, a polarizing layer 11, an optical adhesive layer 12, a cap plate 13, etc., are further arranged above the encapsulation layer sequentially, although the embodiment of the disclosure will not be limited thereto.

Based upon the same inventive idea, an embodiment of the disclosure further provides a display device including the touch display panel according to any one of the embodiments above of the disclosure. Since the display device addresses the problem under a similar principle to that of the touch display panel above, where the display device can be a mobile phone, a tablet computer, a TV set, a display, a notebook computer, a digital photo frame, a navigator, or any other product or component capable of displaying, reference can be made to the implementation of the touch display panel above for an implementation of the display device, so a repeated description thereof will be omitted here.

Figure 6:
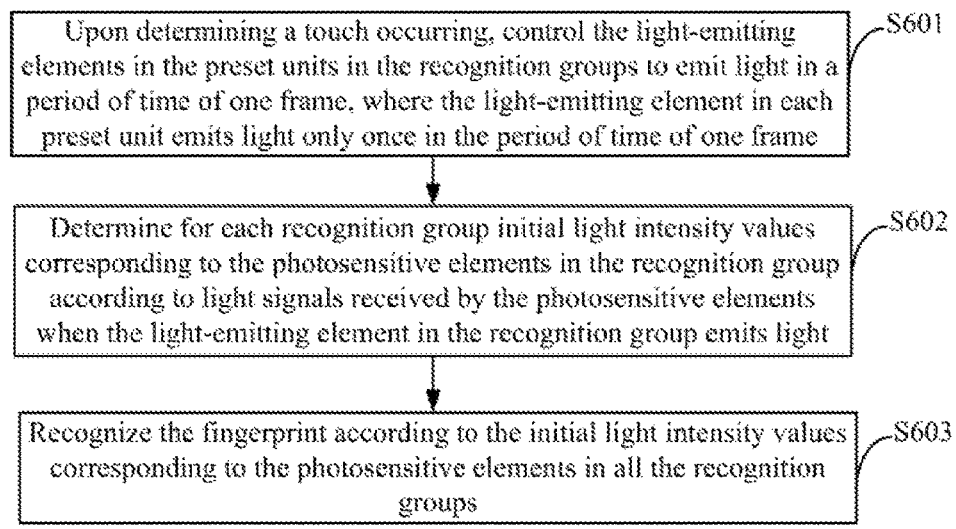
FIG. 6 is a flow chart of a method for recognizing a fingerprint on a touch panel according to an embodiment of the disclosure.

Based upon the same inventive idea, an embodiment of the disclosure further provides a method for recognizing a fingerprint on a touch panel. The touch panel includes a plurality of fingerprint recognizing units arranged in a matrix, where each of the fingerprint recognizing unit includes a light-emitting element and a photosensitive element; and M*N fingerprint recognizing units are defined as a recognition group including at least two fingerprint recognizing units, there are a plurality of recognition groups in the touch panel, one of the fingerprint recognizing units in each recognition group is specified as a preset unit, and there are different preset units in different recognition groups. As illustrated in FIG. 6, the method for recognizing a finger print includes the following steps.

The step S601 is to control the light-emitting elements in the preset units in the respective recognition groups to emit light in a period of time of one frame, upon determining a touch occurring, where the light-emitting element in each preset unit emits light only once in the period of time of one frame.

The step S602 is to determine for each recognition group initial light intensity values corresponding to the photosensitive elements in the recognition group according to light signals received by the photosensitive elements when the light-emitting element in the recognition group emits light.

The step S603 is to recognize the fingerprint according to the initial light intensity values corresponding to the photosensitive elements in all the recognition groups.

In the method for recognizing a fingerprint on a touch panel according to the embodiment of the disclosure, the light-emitting element in the preset unit in each recognition group is controlled to emit light in a period of time of one frame, upon determining a touch occurring, the light intensity value at the position corresponding to the recognition group is determined according to the light signals received by the photosensitive elements in the recognition group, and the fingerprint is recognized according to the light intensity values in all the recognition groups. In this method, the plurality of fingerprint recognizing units are divided into the recognition groups, where only the light-emitting element in the preset unit in each recognition group emits light, and the light-emitting elements in the fingerprint recognizing units in each recognition group other than the preset unit do not emit light, so that the light received by the photosensitive elements in the preset unit are light emitted by the light-emitting element in the preset unit without any crosstalk of light emitted from the light-emitting elements in the other fingerprint recognizing units in the recognition group.

In the method for recognizing a fingerprint on a touch panel according to the embodiments of the disclosure, the period of time of one frame refers to a period of time in which the preset units in all the recognition groups in the touch panel emit light one time.

In the method for recognizing a fingerprint on a touch panel according to the embodiments of the disclosure, for each fingerprint recognizing unit, the fingerprint recognizing unit belongs to at least one recognition group, and not all the fingerprint recognizing units in two adjacent recognition groups are the same.

In a specific implementation, in the method for recognizing a fingerprint on a touch panel according to the embodiments of the disclosure, each fingerprint recognizing unit belongs to at least one recognition group so that the photosensitive elements in the touch panel can be utilized efficiently for more precise fingerprint information; and not all the fingerprint recognizing units in two adjacent recognition groups are the same to avoid repeatedly calculating for the same recognition group. Optionally, a fingerprint recognizing unit belongs to only one recognition group, that is, there is no fingerprint recognizing unit common to adjacent recognition groups, or a fingerprint recognizing unit belongs to at least two recognition groups, that is, there is a fingerprint recognizing unit common to adjacent recognition groups. When there are a fixed number of fingerprint recognizing units in a recognition group, there may be a larger total number of recognition groups on the touch panel, and also higher precision of fingerprint recognition, but a higher computing processing capacity to be required, in the instance in there is a fingerprint recognizing unit common to adjacent recognition groups as compared with the instance in there is no fingerprint recognizing unit common to adjacent recognition groups.

In the method for recognizing a fingerprint on a touch panel according to the embodiments of the disclosure, in order to avoid crosstalk between adjacent recognition groups, the light-emitting elements in the preset units in the adjacent recognition groups can be controlled not to emit light at the same time, or the light-emitting elements in the preset units in the respective recognition groups can be arranged to emit different light, specifically at different frequencies, wavelengths, phases, light intensities, etc., from each other.

In the method for recognizing a fingerprint on a touch panel according to the embodiments of the disclosure, when the light-emitting elements in the preset units emit the same light, the light-emitting elements in the preset units in the respective recognition groups are controlled to emit light, in the step S601 specifically as follows:

The light-emitting elements in the preset units in two adjacent recognition groups are controlled not to emit light at the same time. That is, when the light-emitting elements emit the same light, the instances of time when the light-emitting elements in the preset units in the recognition groups emit light are controlled to thereby prevent crosstalk between reflected light received by the adjacent recognition groups.

In the method for recognizing a fingerprint on a touch panel according to the embodiments of the disclosure, the light-emitting elements in the respective preset units emit the same light, and the light-emitting elements in the preset units in the respective recognition groups are controlled to emit light, specifically as follows:

The light-emitting elements in the preset units in the respective recognition groups are controlled to emit light sequentially.

In the method for recognizing a fingerprint on a touch panel according to the embodiments of the disclosure, in the case that there is no crosstalk between reflected light received by two recognition groups located at a preset distance from each other, the two recognition groups can emit light at the same time, although the embodiment of the disclosure will not be limited thereto.

In the method for recognizing a fingerprint on a touch panel according to the embodiments of the disclosure, light-emitting elements in at least any two adjacent preset units emit different light, and the light-emitting elements in the preset units in the respective recognition groups are controlled to emit light, in the step S601 specifically as follows.

The light-emitting elements in the preset units in the respective recognition groups are controlled to emit light at the same time.

Alternatively the light-emitting elements in the preset units in the respective recognition groups are controlled to emit light sequentially.

Alternatively the light-emitting elements in the preset units in adjacent recognition groups are controlled not to emit light at the same time.

In the method for recognizing a fingerprint on a touch panel according to the embodiments of the disclosure, when the light-emitting elements in the preset units in the two adjacent recognition groups are controlled not to emit light at the same time, the light-emitting elements in the preset units in two or more nonadjacent recognition groups may or may not emit light at the same time, although the embodiment of the disclosure will not be limited thereto.

When the light-emitting elements in the preset units in two recognition groups between which there may be light crosstalk emit different light, the light-emitting elements in the preset units in the recognition groups are controlled to emit light at the same time to thereby dispense with controlling the timing of the respective light-emitting elements. Since the light-emitting elements transmit different light source information, when the same photosensitive element receives the different light, it can separate the light according to the different light source information, and recognize a fingerprint using the corresponding light signals resulting from the separation, thus preventing light crosstalk between the respective recognition groups. Of course, the light-emitting elements in the preset units in the respective recognition groups can alternatively be controlled to emit light sequentially, although the embodiment of the disclosure will not be limited thereto.

In the method for recognizing a fingerprint on a touch panel according to the embodiments of the disclosure, the fingerprint is recognized according to the initial light intensity values corresponding to the respective photosensitive elements in all the recognition groups in the step S603 specifically as follows.

For the respective recognition groups, light intensity distribution corresponding to the respective recognition groups is determined according to the initial light intensity values corresponding to the respective photosensitive elements in all the recognition groups.

The fingerprint is recognized according to the light intensity distribution corresponding to all recognition groups.

Since light is absorbed and reflected differently at different positions of the fingerprint, there are specific regular light intensity distributions of the light received by the photosensitive elements in the respective fingerprint recognition groups, and the position corresponding to the fingerprint can be determined according to the light intensity distribution, that is, the fingerprint is recognized according to the light intensity distribution corresponding to the respective recognition groups.

In the method for recognizing a fingerprint on a touch panel according to the embodiments of the disclosure, the fingerprint is recognized according to the initial light intensity values corresponding to the respective photosensitive elements in all the recognition groups in the step S603 specifically as follows.

For the respective recognition groups, accumulated light intensity values are estimated according to the initial light intensity values corresponding to the photosensitive elements in the other fingerprint recognizing units than the preset units.

Light intensity values at the positions corresponding to the recognition groups are calculated according to the initial light intensity values corresponding to the photosensitive elements in the preset units, and the accumulated light intensity values.

The fingerprint is recognized according to the light intensity values corresponding to the respective recognition groups.

In a particular implementation, the respective photosensitive elements receive such low light intensity values that it is difficult to recognize the fingerprint, so the accumulated light intensity values need to be estimated according to the initial light intensity values corresponding to the photosensitive elements in the other fingerprint recognizing units than the preset units, and to be accumulated into the corresponding preset units to thereby better recognize the fingerprint.

In the method for recognizing a fingerprint on a touch panel according to the embodiments of the disclosure, the preset units are fingerprint recognizing units in the recognition groups proximate to their centers to thereby enable the preset units in the respective recognition groups to be located at some distance from each other so as to prevent light crosstalk between the preset units in the respective recognition groups when the preset units are located close to each other.

In the method for recognizing a fingerprint on a touch panel according to the embodiments of the disclosure, M is 3, and N is 3.

Figure 7:
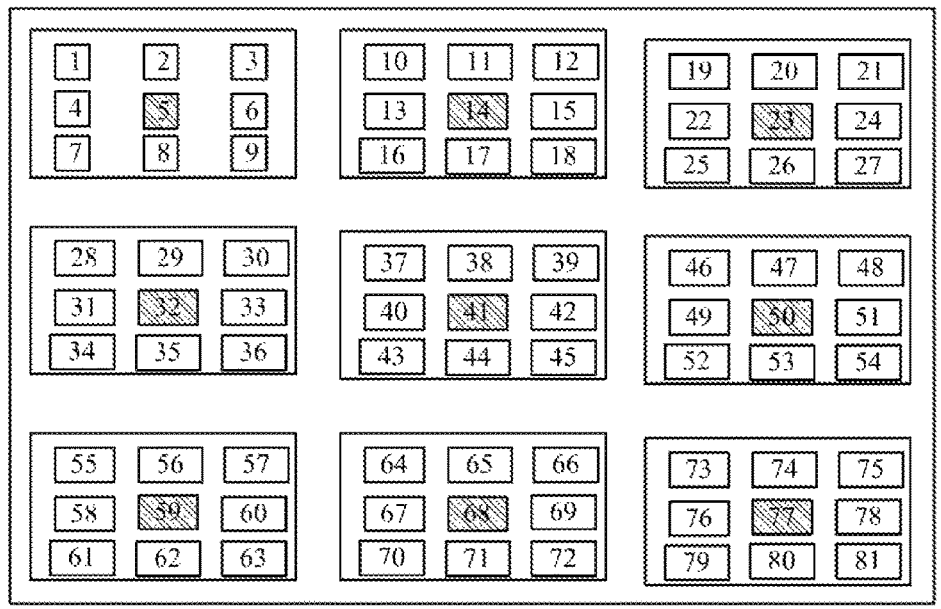
FIG. 7 is a first schematic structural diagram of a touch display panel according to an embodiment of the disclosure.

Taking the touch display panel in FIG. 7 as an example below in which when there are no fingerprint recognizing units common to the respective recognition groups, for example, there are 81 fingerprint recognizing units in the touch panel, and each matrix of 3 rows by 3 columns including 9 fingerprint recognizing unit are divided into a recognition group, thus resulting in 9 recognition groups in total in the touch panel. A fingerprint recognizing unit located at the center of each recognition group is a preset unit, an operating principle of the method for recognizing a fingerprint on a touch panel according to the embodiment of the disclosure will be described below in details.

In a first instance:

When all the light-emitting elements emit the same light, that is, the light-emitting elements in the preset units 5, 14, 23, 32, 41, 50, 59, 68, and 77 emit the same light, the light-emitting elements in the preset units 5, 14, 23, 32, 41, 50, 59, 68, and 77 are controlled to emit light sequentially in a descending order of their sequence numbers, the photosensitive elements in the fingerprint recognizing units in the respective recognition groups receive reflected light signals, i.e., initial light intensity values, at different instances of time, light intensity distribution of the respective recognition groups can be obtained according to the initial light intensity values received by the photosensitive elements in the respective recognition groups, and the fingerprint is recognized according to the light intensity distribution of the respective recognition groups. Of course, in order to avoid the signals received by the photosensitive elements in the preset units from being too weak, which would otherwise hinder the finger from being recognized, the initial light intensity values received by the respective photosensitive elements in the other fingerprint recognizing units than the preset units in the respective recognition groups can be accumulated into accumulated light intensity values in a preset algorithm, for example, the initial light intensity values received by the photosensitive elements in the fingerprint recognizing units 1, 2, 3, 4, 6, 7, 8, and 9 are accumulated into accumulated light intensity values, the accumulated light intensity values can be accumulated into the initial light intensity values received by the photosensitive elements in their corresponding preset units to obtain light intensity values of the recognition groups, and the fingerprint can be recognized according to the light intensity values of the recognition groups.

Of course, in a specific implementation, in the case that there is no light crosstalk between the preset units 5 and 50, the preset units 5 and 50 can emit light at the same time.

In a second instance:

When all the light-emitting elements emit different light, that is, the light-emitting elements in the preset units 5, 14, 23, 32, 41, 50, 59, 68, and 77 emit different light, the light-emitting elements in the respective preset units emit light at the same time, and in this case, the fingerprint recognizing units in the adjacent recognition groups can receive the light emitted from the preset units in the adjacent recognition groups, for example, the photosensitive elements in the fingerprint recognizing units 3, 6, and 9 receive the light transmitted by the preset unit 14, e.g., second light signals, and the photosensitive elements in the fingerprint recognizing units 10, 13, and 16 receive the light transmitted by the preset unit 5, e.g., first light signals, where there are different frequencies, wavelengths, phases, light intensitys, etc., of light in the first light signal and the second light signals, the light received by the photosensitive elements in the fingerprint recognizing units 3, 6, 9, 10, 13, and 16 can be separated respectively into the first light signals and the second light signals, and the fingerprint can be recognized according to light intensity distributions of the first light signals and the second light signals. Of course, in order to avoid the signals received by the photosensitive elements in the preset units transmitting the first signal and the second signal from being too weak, the first light signals received by the photosensitive elements in the fingerprint recognizing units 1, 2, 3, 4, 5, 6, 7, 8, 9, 10, 13, and 16 can be accumulated into a first accumulated strength value in a preset algorithm, and the first accumulated strength value, and the initial strength value received by the preset unit 5 can be accumulated into a strength value of the recognition group including the preset unit 5; and the second light signals received by the photosensitive elements in the fingerprint recognizing units 10, 11, 12, 13, 15, 16, 17, 18, 3, 6, and 9 can be accumulated into a second accumulated strength value in the preset algorithm, and the second accumulated strength value, and the initial strength value received by the preset unit 14 can be accumulated into a strength value of the recognition group including the preset unit 14. Alike the strength values of the other recognition groups can be calculated, and the fingerprint can be recognized according to the strength values of the respective recognition groups. Of course, when all the light-emitting elements emit different light, the light-emitting elements in the preset units in the respective recognition groups can emit light sequentially, that is, the light-emitting elements in the preset units 5, 14, 23, 32, 41, 50, 59, 68, and 77 emit light sequentially, where the light intensity values of the respective recognition groups are determined under the same principle as when the light-emitting elements in the respective preset units emit light at the same time, where all the light-emitting elements emit light different light, so a repeated description thereof will be omitted here.

Taking two recognition groups in the touch display panel in FIG. 8 as an example below in which when there are fingerprint recognizing units common to the respective recognition groups, for example, the first recognition group includes the fingerprint recognizing units 1, 2, 3, 4, 5, 6, 7, 8, and 9, and the second recognition group includes the fingerprint recognizing units 3, 6, 9, 10, 11, 12, 13, 14, and 15, an operating principle of the method for recognizing a fingerprint on a touch panel according to the embodiment of the disclosure will be described below in details.

Figure 8:
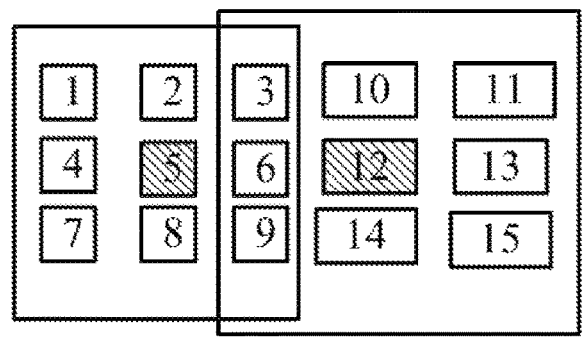
FIG. 8 is a second schematic structural diagram of a touch display panel according to an embodiment of the disclosure.

In a first instance:

When all the light-emitting elements emit the same light, that is, the light-emitting elements in the preset unit 5 and the preset unit 12 emit the same light as illustrated in FIG. 8, the light-emitting elements in the preset unit 5 and the preset unit 12 are controlled not to emit light at the same time, and when the light-emitting element in the preset unit 5 emits light, initial light intensity values received by the photosensitive elements in the other fingerprint recognizing units than the preset unit 5 are accumulated into a first accumulated light intensity value, and the first accumulated light intensity value and an initial light intensity value received by the photosensitive element in the preset unit 5 are accumulated to obtain a finger recognition light intensity value of the recognition group including the preset unit 5; and when the light-emitting element in the preset unit 12 emits light, initial light intensity values received by the photosensitive elements in the other fingerprint recognizing units than the preset unit 12 are accumulated into a second accumulated light intensity value, and the second accumulated light intensity value and an initial light intensity value received by the photosensitive element in the preset unit 12 are accumulated to obtain a finger recognition light intensity value of the recognition group including the preset unit 12. Of course, finger recognition light intensity values of the other recognition groups (not illustrated in FIG. 8) can be calculated alike.

In a second instance:

When all the light-emitting elements emit different light, as illustrated in FIG. 8, the preset unit 5 in a first recognition group emits a first light signal, and the preset unit 12 in a second recognition group emits a second light signal. Since the light-emitting elements in the preset unit 5 and the preset unit 12 emit different light, they can emit light at the same time. As illustrated in FIG. 8, for example, the photosensitive elements in the fingerprint recognizing units 3, 6, and 9 receive both the first light signals and the second light signals, and in this case, the first light signals and the second light signals are separated according to their different optical characteristics, and the first light signals received by the photosensitive elements in the fingerprint recognizing units 3, 6, and 9, and the first light signals received by the fingerprint recognizing units 1, 2, 4, 7, and 8 are accumulated to obtain a third accumulated light intensity value, and the third accumulated light intensity value and an initial light intensity value received by the preset unit 5 are accumulated to obtain a finger recognition light intensity value of the recognition group including the preset unit 5; and the second light signals received by the photosensitive elements in the fingerprint recognizing units 3, 6, and 9, and the second light signals received by the fingerprint recognizing units 10, 11, 13, 14, and 15 are accumulated into a fourth accumulated light intensity value, and the fourth accumulated light intensity value, and an initial light intensity value received by the preset unit 12 are accumulated into a finger recognition light intensity value of the recognition group including the preset unit 12. Of course, finger recognition light intensity values of the other recognition groups (not illustrated in FIG. 8) can be calculated alike.

In the touch panel, the display panel, the display device, and the method for recognizing a fingerprint above according to the embodiments of the disclosure, the touch panel includes: the underlying substrate, the plurality of fingerprint recognizing units located on the underlying substrate, and the encapsulation layer covering the plurality of fingerprint recognizing units, where the fingerprint recognizing units include the light-emitting elements and the photosensitive elements; and the touch panel further includes: the light path limiting structure arranged above the light-emitting element, where the light path limiting structure is arranged above the light-emitting element to enable the light emitted from the light-emitting element to be totally reflected to thereby be transmitted in the light path limiting structure, and to exit the light path limiting structure by being concentrated in a small angle range, so that the light is equivalently emitted from the light-emitting element by being nearly collimated, and incident on a fingerprint to be recognized, in a small range, so the light can be reflected at a concentrated angle, and the majority of the light can be incident on the photosensitive element corresponding to the light-emitting elements, thus avoiding crosstalk between the light received by the photosensitive elements in the different recognizing units so as to recognize accurately the fingerprint.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

What is claimed is:

1. A touch panel, comprising:
an underlying substrate;
a plurality of fingerprint recognizing units located on the underlying substrate, each of the fingerprint recognizing units comprises a light-emitting element and a photosensitive element;
an encapsulation layer covering the plurality of fingerprint recognizing units; and
a light path limiting structure arranged above the light-emitting element, wherein:
the light path limiting structure comprises a central area, and a peripheral area surrounding at least a part of the central area, wherein the refractive index of the peripheral area is less than the refractive index of the central area; and the light path limiting structure is configured to enable light emitted from the light-emitting element to be reflected in the central area to the peripheral area, and to be totally reflected in the peripheral area, and then exit the side of the light path limiting structure away from the light-emitting element.

2. The touch panel according to claim 1, wherein the light path limiting structure is located between the encapsulation layer and the light-emitting element.

3. The touch panel according to claim 1, wherein the light path limiting structure is arranged in the encapsulation layer, and the peripheral area of the light path limiting structure is one or more grooves arranged in the encapsulation layer.

4. The touch panel according to claim 3, wherein a filler is filled in the grooves, and the refractive index of the filler is less than the refractive index of the encapsulation layer.

5. The touch panel according to claim 4, wherein the filler is a humidity and oxygen blocking material.

6. The touch panel according to claim 1, wherein the peripheral area is an annular area surrounding the central area.

7. The touch panel according to claim 1, wherein the touch panel further comprises a first condensing lens located between the light-emitting element and the light path limiting structure.

8. The touch panel according to claim 7, wherein the touch panel further comprises a second condensing lens located above the photosensitive element.

9. A touch display panel, comprising a display panel and a touch panel, wherein the touch panel comprising:
an underlying substrate;
a plurality of fingerprint recognizing units located on the underlying substrate, each of the fingerprint recognizing units comprises a light-emitting element and a photosensitive element;
an encapsulation layer covering the plurality of fingerprint recognizing units; and
a light path limiting structure arranged on the light-emitting element, wherein:
the light path limiting structure comprises a central area, and a peripheral area surrounding at least a part of the central area, wherein the refractive index of the peripheral area is less than the refractive index of the central area; and the light path limiting structure is configured to enable light emitted from the light-emitting element to be reflected in the central area to the peripheral area, and to be totally reflected in the peripheral area, and then exit the side of the light path limiting structure away from the light-emitting element.

10. The touch display panel according to claim 9, wherein the display panel comprises a plurality of pixel areas arranged in a matrix, and each of the pixel areas comprises at least four sub-areas comprising one sub-area in which one of the fingerprint recognizing units in the touch panel is arranged, and the other sub-areas in which organic electroluminescent pixels for displaying are arranged.

11. A display device, comprising the touch display panel according to claim 9.

12. A method for recognizing a fingerprint on a touch panel comprising a plurality of fingerprint recognizing units arranged in a matrix, wherein each of the fingerprint recognizing units comprises a light-emitting element and a photosensitive element; wherein M*N fingerprint recognizing units are defined as a recognition group, and the recognition group comprises at least two of the fingerprint recognizing units, there are a plurality of recognition groups in the touch panel, one of the fingerprint recognizing units in each recognition group is specified as a preset unit, and there are different preset units in different recognition groups; and the method for recognizing a fingerprint comprises:
upon determining a touch occurring, controlling the light-emitting elements in the preset units in the recognition groups to emit light in a period of time of one frame, wherein the light-emitting element in each preset unit emits light only once in the period of time of one frame;
for each recognition group, determining initial light intensity values corresponding to the photosensitive elements in the recognition group according to light signals received by the photosensitive elements when the light-emitting element in the recognition group emits light; and
recognizing the fingerprint according to the initial light intensity values corresponding to the photosensitive elements in the plurality of recognition groups.

13. The method according to claim 12, wherein for each of the fingerprint recognizing units, the fingerprint recognizing unit belongs to at least one of the recognition groups, and not all the fingerprint recognizing units in two adjacent recognition groups are the same.

14. The method according to claim 13, wherein the light-emitting elements in the preset units emit the same light, controlling the light-emitting elements in the preset units in the recognition groups to emit light comprises:
controlling the light-emitting elements in the preset units in two adjacent recognition groups not to emit light at the same time.

15. The method according to claim 13, wherein the light-emitting elements in the preset units emit the same light, controlling the light-emitting elements in the preset units in the recognition groups to emit light comprises:
controlling the light-emitting elements in the preset units in the recognition groups to emit light sequentially.

16. The method according to claim 13, wherein light-emitting elements in at least any two adjacent preset units emit different light, controlling the light-emitting elements in the preset units in the recognition groups to emit light comprises:
controlling the light-emitting elements in the preset units in the recognition groups to emit light at the same time; or
controlling the light-emitting elements in the preset units in the recognition groups to emit light sequentially; or controlling the light-emitting elements in the preset units in the recognition groups not to emit light at the same time.

17. The method according to claim 12, wherein recognizing the fingerprint according to the initial light intensity values corresponding to the photosensitive elements in the recognition groups comprises:

for the recognition groups, determining light intensity distribution corresponding to the recognition groups according to the initial light intensity values corresponding to the photosensitive elements in the recognition groups; and recognizing the fingerprint according to the light intensity distribution corresponding to the recognition groups.

18. The method according to claim 12, wherein recognizing the fingerprint according to the initial light intensity values corresponding to the photosensitive elements in the recognition groups comprises:

for each of the recognition groups, estimating an accumulated light intensity value according to the initial light intensity values corresponding to the photosensitive elements in the other fingerprint recognizing units than the preset unit;

calculating a light intensity value at the position corresponding to the recognition group according to the initial light intensity value corresponding to the photosensitive element in the preset unit and the accumulated light intensity value; and recognizing the fingerprint according to the light intensity values corresponding to the plurality of recognition groups.

19. The method according to claim 12, wherein the preset unit is the fingerprint recognizing unit in the recognition group proximate to its center.

* * * * *